(12) United States Patent
Ibbetson et al.

(10) Patent No.: US 10,505,083 B2
(45) Date of Patent: Dec. 10, 2019

(54) COATING METHOD UTILIZING PHOSPHOR CONTAINMENT STRUCTURE AND DEVICES FABRICATED USING SAME

(75) Inventors: James Ibbetson, Santa Barbara, CA (US); Kristi Wong, Santa Barbara, CA (US); Maryanne Becerra, Santa Barbara, CA (US)

(73) Assignee: CREE, INC., Durham, NC (US)

( * ) Notice: Subject to any disclaimer, the term of this patent is extended or adjusted under 35 U.S.C. 154(b) by 496 days.

(21) Appl. No.: 11/827,626

(22) Filed: Jul. 11, 2007

(65) Prior Publication Data

US 2009/0014736 A1  Jan. 15, 2009

(51) Int. Cl.
*H01L 33/00* (2010.01)
*H01L 33/50* (2010.01)
(Continued)

(52) U.S. Cl.
CPC ........... *H01L 33/508* (2013.01); *H01L 33/44* (2013.01); *H01L 33/54* (2013.01); *H01L 2933/0041* (2013.01)

(58) Field of Classification Search
CPC ....... H01L 33/508; H01L 33/44; H01L 33/54; H01L 2933/0041
(Continued)

(56) References Cited

U.S. PATENT DOCUMENTS 4,308,114 A * 12/1981 Das et al. .................. 205/380
4,733,335 A    3/1988 Serizawa et al. ......... 362/503
(Continued)

FOREIGN PATENT DOCUMENTS

DE  102005062514  3/2007
EP     0732740 A2  9/1996
(Continued)

OTHER PUBLICATIONS

International Search Report and Written Opinion from related PCT Application No. PCT/US2009/001572, dated Jul. 17, 2009.
(Continued)

*Primary Examiner* — Ori Nadav
(74) *Attorney, Agent, or Firm* — Ferguson Case Orr Paterson LLP (57) ABSTRACT

Methods for fabricating a semiconductor devices, and in particular light emitting diodes (LEDS) comprising providing a plurality of semiconductor devices on a substrate and forming a contact on at least some of the semiconductor devices. A containment structure is formed on at least some of the semiconductor devices having a contact with each containment structure defining a deposition area excluding the contact. A coating material is deposited then within the deposition area, with the coating material not covering the contact. A light emitting diode (LED) chip wafer comprising a plurality of LEDs on a substrate wafer with at least some of the LEDs having a contact. A plurality of containment structures are included, each of which is associated with a respective one of the plurality of LEDs. Each of the containment structures at least partially on its respective one of the LEDs and defining a deposition area on its respective one of the LEDs. The deposition area excludes the contact. A coating is included in each of the deposition areas.

37 Claims, 7 Drawing Sheets

(51) Int. Cl.
*H01L 33/44* (2010.01)
*H01L 33/54* (2010.01)

(58) Field of Classification Search
USPC .............. 257/E33, 79–103, E33.001, 98.99;
438/27, 29
See application file for complete search history.

(56) References Cited

U.S. PATENT DOCUMENTS

| | | | |
|---|---|---|---|
| 4,902,535 A * | 2/1990 | Garg et al. .................. 139/292 |
| 4,918,497 A | 4/1990 | Edmond ....................... 357/17 |
| 4,935,665 A | 6/1990 | Murata ........................ 313/500 |
| 4,946,547 A | 8/1990 | Palmour et al. ............. 156/643 |
| 4,966,862 A | 10/1990 | Edmond ....................... 437/100 |
| 5,027,168 A | 6/1991 | Edmond ....................... 357/17 |
| 5,200,022 A | 4/1993 | Kong et al. .................. 156/612 |
| 5,210,051 A | 5/1993 | Carter, Jr. .................... 437/107 |
| 5,277,840 A | 1/1994 | Osaka et al. ............. 252/301.36 |
| 5,338,944 A | 8/1994 | Edmond et al. ................. 257/76 |
| RE34,861 E | 2/1995 | Davis et al. .................. 437/100 |
| 5,393,993 A | 2/1995 | Edmond et al. ................. 257/77 |
| 5,416,342 A | 5/1995 | Edmond et al. ................. 257/76 |
| 5,523,589 A | 6/1996 | Edmond et al. ................. 257/77 |
| 5,604,135 A | 2/1997 | Edmond et al. ................. 437/22 |
| 5,614,131 A | 3/1997 | Mukerji et al. ................ 264/1.9 |
| 5,631,190 A | 5/1997 | Negley ........................... 438/33 |
| 5,739,554 A | 4/1998 | Edmond et al. ............... 257/103 |
| 5,766,987 A | 6/1998 | Mitchell et al. .............. 438/126 |
| 5,767,573 A * | 6/1998 | Noda et al. .................... 257/675 |
| 5,813,753 A | 9/1998 | Vriens ........................... 362/293 |
| 5,858,278 A | 1/1999 | Itoh et al. ............. 252/301.4 R |
| 5,912,477 A | 6/1999 | Negley ........................... 257/95 |
| 5,923,053 A | 7/1999 | Jakowetz et al. ............... 257/95 |
| 5,959,316 A | 9/1999 | Lowery |
| 5,988,925 A | 11/1999 | Baggett ........................ 313/503 |
| 6,001,671 A | 12/1999 | Fjelstad ....................... 438/112 |
| 6,066,861 A | 5/2000 | Horn et al. .................... 257/99 |
| 6,069,440 A | 5/2000 | Shimizu et al. .............. 313/486 |
| 6,087,202 A | 7/2000 | Exposito et al. ............. 438/113 |
| 6,120,600 A | 9/2000 | Edmond et al. ............... 117/89 |
| 6,132,072 A | 10/2000 | Turnbull et al. ............. 362/494 |
| 6,139,304 A | 10/2000 | Centofante ................... 425/121 |
| 6,153,448 A | 11/2000 | Takahashi .................... 438/114 |
| 6,187,606 B1 | 2/2001 | Edmond et al. ................. 438/46 |
| 6,188,230 B1 * | 2/2001 | Birk ........................ 324/756.05 |
| 6,201,262 B1 | 3/2001 | Edmond et al. ................. 257/77 |
| 6,252,254 B1 | 6/2001 | Soules et al. ................... 257/89 |
| 6,323,480 B1 * | 11/2001 | Tran et al. ................. 250/214.1 |
| 6,329,224 B1 | 12/2001 | Nguyen et al. ............... 438/127 |
| 6,331,063 B1 | 12/2001 | Kamada et al. .............. 362/237 |
| 6,338,813 B1 | 1/2002 | Hsu et al. ................. 264/272.14 |
| 6,376,277 B2 | 4/2002 | Corisis ......................... 438/106 |
| 6,395,564 B1 | 5/2002 | Huang |
| 6,404,125 B1 | 6/2002 | Garbuzou ..................... 313/499 |
| 6,501,100 B1 | 12/2002 | Srivastava |
| 6,522,065 B1 | 2/2003 | Srivastava |
| 6,531,328 B1 | 3/2003 | Chen ............................ 438/26 |
| 6,577,073 B2 | 6/2003 | Shimizu et al. |
| 6,583,444 B2 | 6/2003 | Fjelstad ......................... 257/82 |
| 6,610,563 B1 * | 8/2003 | Waitl et al. ................... 438/166 |
| 6,624,058 B1 | 9/2003 | Kazama ....................... 438/612 |
| 6,635,363 B1 * | 10/2003 | Duclos et al. ................. 428/690 |
| 6,642,652 B2 | 11/2003 | Collins, III et al. .......... 313/512 |
| 6,653,765 B1 | 11/2003 | Levinson |
| 6,733,711 B2 | 5/2004 | Durocher et al. ........ 264/273.24 |
| 6,747,406 B1 * | 6/2004 | Bortscheller et al. ........ 313/512 |
| 6,756,058 B2 * | 6/2004 | Brubaker ............. A61K 9/0051 424/422 |
| 6,759,266 B1 | 7/2004 | Hoffman ........................ 438/64 |
| 6,791,119 B2 | 9/2004 | Slater, Jr. et al. ............... 257/99 |
| 6,791,259 B1 | 9/2004 | Stokes |
| 6,793,371 B2 | 9/2004 | Lamke et al. ................ 362/241 |
| 6,812,500 B2 | 11/2004 | Reeh et al. .................... 257/98 |
| 6,841,934 B2 | 1/2005 | Wang et al. ................... 313/512 |
| 6,853,010 B2 | 2/2005 | Slater, Jr. et al. ............. 257/98 |
| 6,860,621 B2 | 3/2005 | Bachl et al. .................. 362/373 |
| 6,891,259 B2 * | 5/2005 | Im et al. ....................... 257/687 |
| 6,919,683 B1 | 7/2005 | Jang ............................. 313/503 |
| 6,939,481 B2 | 9/2005 | Srivastava |
| 6,958,497 B2 | 10/2005 | Emerson et al. ............... 257/94 |
| 7,023,019 B2 | 4/2006 | Maeda et al. .................. 257/89 |
| 7,029,935 B2 | 4/2006 | Negley et al. |
| 7,049,159 B2 * | 5/2006 | Lowery .......................... 438/22 |
| 7,051,965 B2 * | 5/2006 | Nishimura ................... 242/310 |
| 7,122,937 B2 * | 10/2006 | Hatakeyama et al. ........ 310/309 |
| 7,126,273 B2 * | 10/2006 | Sorg ............................. 313/512 |
| 7,176,612 B2 * | 2/2007 | Omoto et al. ................. 313/487 |
| 7,183,587 B2 | 2/2007 | Negley et al. .................. 257/99 |
| 7,195,944 B2 * | 3/2007 | Tran et al. ....................... 438/46 |
| 7,202,598 B2 | 4/2007 | Juestel et al. ................. 313/503 |
| 7,260,123 B2 | 8/2007 | Sato ............................. 372/22 |
| 7,286,296 B2 | 10/2007 | Chaves et al. ................. 359/641 |
| 7,312,106 B2 * | 12/2007 | Raben ........................... 438/112 |
| 7,361,938 B2 | 4/2008 | Mueller et al. ................. 257/94 |
| 7,371,603 B2 * | 5/2008 | Kim et al. ...................... 438/64 |
| 7,510,890 B2 | 3/2009 | Ott et al. ....................... 438/29 |
| 7,535,089 B2 * | 5/2009 | Fitzgerald ......... H01L 21/76254 257/103 |
| 7,601,550 B2 | 10/2009 | Bogner |
| 7,646,035 B2 * | 1/2010 | Loh et al. ...................... 257/99 |
| 7,655,957 B2 | 2/2010 | Loh et al. ...................... 257/99 |
| 7,804,103 B1 | 9/2010 | Zhai et al. ..................... 257/98 |
| 7,858,403 B2 | 12/2010 | Hiller et al. |
| 7,910,938 B2 * | 3/2011 | Hussell et al. ................. 257/98 |
| 7,994,531 B2 * | 8/2011 | Lin et al. ....................... 257/98 |
| 8,207,546 B2 * | 6/2012 | Harada et al. ................. 257/98 |
| 2002/0001869 A1 | 1/2002 | Fjelstad |
| 2002/0006040 A1 | 1/2002 | Kamada et al. |
| 2002/0070449 A1 | 6/2002 | Yagi et al. |
| 2002/0096789 A1 | 7/2002 | Bolken |
| 2002/0105266 A1 | 8/2002 | Juestel et al. |
| 2002/0123164 A1 | 9/2002 | Slater, Jr. et al. |
| 2002/0185965 A1 | 12/2002 | Collins, III et al. |
| 2003/0006418 A1 | 1/2003 | Emerson et al. |
| 2003/0038596 A1 | 2/2003 | Ho |
| 2003/0042852 A1 * | 3/2003 | Chen ................... H01L 51/5246 313/512 |
| 2003/0066311 A1 | 4/2003 | Li et al. |
| 2003/0121511 A1 | 7/2003 | Hashimura et al. |
| 2003/0141510 A1 * | 7/2003 | Brunner et al. ................ 257/81 |
| 2003/0207500 A1 | 11/2003 | Pichler et al. |
| 2004/0004435 A1 | 1/2004 | Hsu |
| 2004/0037949 A1 | 2/2004 | Wright |
| 2004/0038442 A1 | 2/2004 | Kinsman |
| 2004/0041222 A1 | 3/2004 | Loh |
| 2004/0056260 A1 | 3/2004 | Slater, Jr. et al. |
| 2004/0080939 A1 | 4/2004 | Braddell et al. |
| 2004/0106234 A1 | 6/2004 | Sorg et al. |
| 2004/0124429 A1 | 7/2004 | Stokes et al. |
| 2004/0164307 A1 | 8/2004 | Mueller-Mach et al. |
| 2004/0012958 A1 | 12/2004 | Hashimoto |
| 2004/0264193 A1 | 12/2004 | Okumura ...................... 362/276 |
| 2005/0002168 A1 | 1/2005 | Narhi et al. |
| 2005/0021191 A1 | 1/2005 | Taniguchi et al. |
| 2005/0057813 A1 | 3/2005 | Hasei et al. |
| 2005/0077529 A1 | 4/2005 | Shen |
| 2005/0122031 A1 | 6/2005 | Itai et al. |
| 2005/0196886 A1 | 9/2005 | Jager et al. |
| 2005/0221519 A1 | 10/2005 | Leung et al. |
| 2005/0265404 A1 | 12/2005 | Ashdown |
| 2005/0280894 A1 * | 12/2005 | Hartkop et al. .............. 359/464 |
| 2006/0001046 A1 * | 1/2006 | Batres et al. ................. 257/202 |
| 2006/0003477 A1 | 1/2006 | Braune et al. |
| 2006/0034082 A1 | 2/2006 | Park et al. |
| 2006/0091788 A1 | 5/2006 | Yan |
| 2006/0102914 A1 | 5/2006 | Smits et al. ................... 257/98 |
| 2006/0157721 A1 | 7/2006 | Tran et al. |
| 2006/0258028 A1 | 11/2006 | Paolini et al. ................. 438/22 |
| 2007/0012940 A1 | 1/2007 | Suh et al. |
| 2007/0018573 A1 | 1/2007 | Shioi |
| 2007/0040503 A1 * | 2/2007 | Chase ..................... H01J 9/247 313/567 |
| 2007/0096131 A1 | 5/2007 | Chandra |

(56) References Cited

U.S. PATENT DOCUMENTS

| | | | |
|---|---|---|---|
| 2007/0120135 A1* | 5/2007 | Soules | H01L 33/507 257/98 |
| 2007/0158669 A1 | 7/2007 | Lee et al. | |
| 2007/0165403 A1* | 7/2007 | Park | 362/247 |
| 2007/0205425 A1 | 9/2007 | Harada | 257/98 |
| 2007/0295975 A1 | 12/2007 | Omae | 257/89 |
| 2008/0006815 A1 | 1/2008 | Wang et al. | |
| 2008/0006839 A1 | 1/2008 | Lin | 257/98 |
| 2008/0173884 A1* | 7/2008 | Chitnis et al. | 257/98 |
| 2008/0203410 A1 | 8/2008 | Brunner et al. | |
| 2009/0001473 A1 | 1/2009 | Ibbetson et al. | 257/96 |
| 2009/0057690 A1 | 3/2009 | Chakraborty | |
| 2009/0065791 A1* | 3/2009 | Yen et al. | 257/98 |
| 2009/0086475 A1 | 4/2009 | Caruso et al. | 362/231 |
| 2009/0117672 A1 | 5/2009 | Caruso et al. | |
| 2009/0261358 A1 | 10/2009 | Chitnis et al. | 257/88 |
| 2010/0155750 A1 | 6/2010 | Donofrio | 257/91 |
| 2010/0308361 A1 | 12/2010 | Beeson et al. | 257/98 |
| 2011/0070668 A1 | 3/2011 | Hiller et al. | |
| 2011/0070669 A1 | 3/2011 | Hiller et al. | |
| 2011/0180829 A1 | 7/2011 | Cho | |

FOREIGN PATENT DOCUMENTS

| | | |
|---|---|---|
| EP | 1059678 | 12/2000 |
| EP | 1138747 | 10/2001 |
| EP | 1198016 A2 | 4/2002 |
| EP | 1367655 | 12/2003 |
| EP | 1385215 A2 | 1/2004 |
| EP | 1724848 A | 11/2006 |
| EP | 1724848 A2 | 11/2006 |
| FR | 2704690 | 11/1994 |
| FR | 2704690 A | 11/1994 |
| JP | H0428265 | 1/1992 |
| JP | 11-040858 | 2/1999 |
| JP | 11040848 | 2/1999 |
| JP | H1140848 | 2/1999 |
| JP | 2000002802 | 1/2000 |
| JP | 2000208820 A | 7/2000 |
| JP | 2000-315823 | 11/2000 |
| JP | 2000315823 | 11/2000 |
| JP | 2001-181613 | 7/2001 |
| JP | 2002009097 A | 1/2002 |
| JP | 2002009347 | 1/2002 |
| JP | 2002-050799 | 2/2002 |
| JP | 2002-50799 A | 2/2002 |
| JP | 2002-050799 A | 2/2002 |
| JP | 2002-076446 | 3/2002 |
| JP | 2002-093830 | 3/2002 |
| JP | 2002-531955 | 9/2002 |
| JP | 2002-531956 | 9/2002 |
| JP | 2003-197973 | 7/2003 |
| JP | 2003-258011 | 9/2003 |
| JP | 2003-526212 | 9/2003 |
| JP | 2003-303999 | 10/2003 |
| JP | 2003-318448 | 11/2003 |
| JP | 2003-533852 | 11/2003 |
| JP | 2004-501512 | 1/2004 |
| JP | 2004087812 | 3/2004 |
| JP | 2004179343 | 6/2004 |
| JP | 2004-221185 | 8/2004 |
| JP | 2004363343 | 12/2004 |
| JP | 2005033138 A | 2/2005 |
| JP | 2005508093 | 3/2005 |
| JP | 20055080093 | 3/2005 |
| JP | 2005298817 | 10/2005 |
| JP | 2006054209 | 2/2006 |
| JP | 2006303303 | 11/2006 |
| JP | 2006303373 | 11/2006 |
| JP | 2007324608 | 12/2007 |
| WO | WO 00/33390 | 6/2000 |
| WO | WO 0124283 A | 4/2001 |
| WO | WO 0124283 A1 | 4/2001 |
| WO | WO 03/021668 A1 | 3/2003 |
| WO | WO 03021691 A1 | 3/2003 |
| WO | WO 2005101909 | 10/2005 |
| WO | WO 2006033695 A2 | 3/2006 |
| WO | WO 2006036251 A1 | 4/2006 |
| WO | WO 2002018560 | 2/2007 |
| WO | WO 2007049187 | 5/2007 |
| WO | WO 2008003176 A1 | 1/2008 |

OTHER PUBLICATIONS

Office Action from related U.S. Appl. No. 11/982,276, dated Dec. 7, 2009.
Office Action from related U.S. Appl. No. 12/077,638, dated Dec. 8, 2009.
Official Notice of Rejection re related Japanese Patent Application No. 2007-533459, dated Jul. 29, 2008.
From related application. Japanese Patent Application No. 2006-526964, Official Notice of Rejection, dated Feb. 16, 2010.
Official Notice of Final Decision of Rejection re: related Japanese Patent Application No. 2007-533459, dated Dec. 26, 2008.
Rejection Decision re: related Chinese Patent Application No. 200580031382.3, dated: Feb. 2, 2009.
Communication pursuant to Article 94(3) EPC re: related European Application No. 05808825.3, dated Feb. 18, 2009.
Notice on Reexamination for Chinese Patent Application No. 200580031382.3 dated May 28, 2010.
Examination of related European Application No. 05 808 825.3-2203, dated Mar. 18, 2009.
PCT International Search Report and Written Opinion, PCT/US2007/024366,dated Jul. 15, 2008.
Official Notice of Rejection dated Jul. 29, 2008, Japanese Patent Application No. 2007-533459.
NPO-30394 Electrophoretic Deposition for Fabricating Microbatteries p. 1-2, NASA Tech Briefs Issue May 3, 2003.
Patent Abstracts of Japan vol. 2000, No. 10, Nov. 17, 2000.
Patent Abstracts of Japan vol. 2002, No. 05, May 3, 2002.
Nichia Corp. White LED Part No. NSPW300BS, Specification for Nichia White LED, Model NSPW300BS Jan. 14, 2004.
Nichia Corp. White LED Part No. NSPW312BS, Specification for Nichia White LED, Model NSPW312BS Jan. 14, 2004.
Lau, John, "Flip-Chip Technologies", Mcgraw Hill, 1996.
International Materials Reviews "Materials for Field Emission Displays", A.P. Burden 2001.
Office Action re related U.S. Appl. No. 10/666,399, dated Sep. 5, 2008.
International Search Report for PCT/US2007/024367, dated Oct. 22, 2008.
PCT Search Report and Written Opinion dated Oct. 31, 2007.
Office Action from Japanese Patent Application No. 2007-533459 (Appeal No. 2009-006588) dated Jul. 16, 2010.
Office Action from Chinese Patent Application No. 200780012387.0 dated Jun. 30, 2010.
Summons for Oral Proceedings for European Patent Application No. 05808825.3 dated Sep. 9, 2010.
Notification of the First Office Action for Chinese Patent Application No. 200780050127.2 dated Aug. 8, 2010.
Notice of Rejection for Japanese Patent Application No. 2006-526964 dated Oct. 5, 2010.
Notification of the First Office Action for Chinese Patent Application No. 200780050197.8 dated Sep. 9, 2010.
Reexamination Decision No. 27346 for Chinese Patent Application No. 200580031382.3 dated Oct. 27, 2010.
First Office Action for European Patent Application No. 07754163.9 dated Feb. 28, 2011.
Notice of Rejection from Japanese Patent Application No. 2009-504205, dated Aug. 17, 2011.
Second Office Action from Chinese Patent Application No. 200780012387.0, dated Sep. 5, 2012.
Decision of Rejection for Japanese Patent Application No. 2009-504205, dated Jul. 31, 2012.
First Office Action from Chinese Patent Application No. 200980121201.4, dated Jul. 4, 2012.

(56) References Cited

OTHER PUBLICATIONS

International Search Report and Written Opinion from PCT Appl. No. PCT/US2012/050794, dated Jan. 10, 2013.
Notice of Reasons for Rejection from Japanese Patent Application No. 2011-502981, dated Feb. 5, 2013.
Office Action from Korean Patent Application No. 10-2008-7026531. dated Feb. 14, 2013.
Office Action from U.S. Appl. No. 11/775,958, dated Oct. 24, 2013.
Office Action from U.S. Appl. No. 12/414,457, dated Jul. 18, 2013.
Response to OA from U.S. Appl. No. 12/414,457, filed Oct. 17, 2013.
Third Office Action from Chinese Patent Appl. No. 2007800123870. dated Feb. 14, 2013.
Office Action from U.S. Appl. No. 11/398,214, dated Jun. 10, 2013.
Office Action from U.S. Appl. No. 11/775,958, dated Apr. 8, 2013.
Office Action from U.S. Appl. No. 13/192,293, dated Mar. 27, 2013.
Response to OA from U.S. Appl. No. 13/192,293. filed Jun. 20, 2013.
Office Action from U.S. Appl. No. 13/219,486. dated Feb. 8, 2013.
Response to OA from U.S. Appl. No. 13/219,486, filed May 2, 2013.
Office Action from U.S. Appl. No. 13/219,486, dated Aug. 21, 2012.
Response to OA from U.S. Appl. No. 13/219,486, filed Dec. 18, 2012.
Office Action from U.S. Appl. No. 13/219,486, dated Apr. 19, 2012.
Response to OA from U.S. Appl. No. 13/219,486, filed Jul. 12, 2012.
Office Action from U.S. Appl. No. 11/398,214, dated Apr. 25, 2011.
Response to OA from U.S. Appl. No. 11/398,214, filed Aug. 23, 2011.
Office Action from U.S. Appl. No. 12/414,457, dated Apr. 1, 2011.
Response to OA from U.S. Appl. No. 12/414,457, file Jul. 1, 2011.
Office Action from U.S. Appl. No. 12/414,457, dated Nov. 12, 2010.
Response to OA from U.S. Appl. No. 12/414,457, file Jan. 11, 2011.
Office Action from U.S. Appl. No. 12/414,457, dated Jun. 29, 2010.
Response to OA from U.S. Appl. No. 12/414,457, file Oct. 25, 2010.
Rejection Decision from Chinese Patent Appl. No. 200980121201. 4, dated Sep. 23, 2013.
Decision of Rejection from Japanese Patent Appl. No. 2011-502981, dated Sep. 10, 2013.
Examination Report from European Patent Appl. No. 07 754 163.9-1564, dated Oct. 14, 2013.
Second Office Action from Chinese Application No. 200980121201. 4, dated Mar. 5, 2013.
Interrogatory from Japanese Patent Appl. No. 2009-504205, dated Mar. 19, 2013.
Office Action from U.S. Appl. No. 11/396,214, dated Mar. 7, 2014.
Office Action from U.S. Appl. No. 11/398,214, dated Nov. 22, 2013.
Response to OA from U.S. Appl. No. 11/398,214, filed Jan. 14, 2014.
Office Action from Taiwanese Patent Appl. No. 096111808, dated Nov. 7, 2013.
Allowed Claims from Taiwanese Patent Appl. No. 096111808, dated Jun. 6, 2014.
Extended European Search Report from European Patent Appl. No. 08160051.2-1551, dated Apr. 24, 2014.
Office Action from U.S. Appl. No. 11/398,214, dated Jun. 12, 2014.
Examination Report from European Patent Appl. No. 09726236.8, dated Aug. 6, 2014.
Office Action from U.S. Appl. No. 11/775,958, dated Oct. 1, 2014.
Notice of Reexamination from Chinese Patent Appl. No. 200980121201. 4, dated Jan. 16, 2015.
Examination Report from European Appl. No. 09 728 238.8, dated Jan. 5, 2015.
Office Action from U.S. Appl. No. 11/775,958, dated Jan. 7, 2015.
Office Action from Korean Patent Appl. No. 10-2010-7024150, dated Mar. 16, 2015.
Office Action from U.S. Appl. No. 11/775,958, dated Apr. 17, 2015.
Notice of Reasons for Rejection from Japanese Appl. No. 2011-502981, dated May 12, 2015.
Summons to attend oral proceedings from European Patent Appl. No. 07754163.9, dated Oct. 8, 2015.
Third Office Action from Chinese Patent Appl. No. 200980121201. 4, dated Oct. 9, 2015.
Office Action from U.S. Appl. No. 11/775,958, dated Oct. 23, 2015.
Decision of Grant from Japanese Patent Appl. No 2011-502981, dated Sep. 1, 2015.
Office Action for Application No. 07754163.9; dated Apr. 8, 2016.
Office Action for Application No. 200980121201.4; dated Mar. 4, 2016.
Office Action for application No. 08160049.6; dated May 6, 2016.
European Office Action for Application No. 09728238.8-1453; dated Aug. 8, 2016.
European Office Action for Application No. 08160049.6-1551; dated Jul. 7, 2017.

* cited by examiner

COATING METHOD UTILIZING PHOSPHOR CONTAINMENT STRUCTURE AND DEVICES FABRICATED USING SAME

This invention was made with Government support under Contract DOC/NIST 70-NANB4H3037. The Government has certain rights in this invention.

BACKGROUND OF THE INVENTION

Field of the Invention

This invention relates fabricating semiconductor devices and in particular methods for coating light emitting diodes (LEDs) and LEDs coated using the method.

Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

Conventional LEDs cannot generate white light from their active layers. Light from a blue emitting LED has been converted to white light by surrounding the LED with a yellow phosphor, polymer or dye, with a typical phosphor being cerium-doped yttrium aluminum garnet (YAG:Ce). The surrounding phosphor material "downconverts" the wavelength of some of the LED's blue light, changing its color to yellow. Some of the blue light passes through the phosphor without being changed while a substantial portion of the light is downconverted to yellow. The LED emits both blue and yellow light, which combine to provide a white light. In another approach light from a violet or ultraviolet emitting LED has been converted to white light by surrounding the LED with multicolor phosphors or dyes.

One conventional method for coating an LED with a phosphor layer utilizes a syringe or nozzle for injecting a phosphor mixed with epoxy resin or silicone polymers over the LED. Using this method, however, it can be difficult to control the phosphor layer's geometry and thickness. As a result, light emitting from the LED at different angles can pass through different amounts of conversion material, which can result in an LED with non-uniform color temperature as a function of viewing angle. Because the geometry and thickness is hard to control, it can also be difficult to consistently reproduce LEDs with the same or similar emission characteristics.

Another conventional method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, using the stencil method can be difficult to control the geometry and layer thickness of the phosphor containing polymer. The stenciling composition may not fully fill the stencil opening such that the resulting layer is not uniform. The phosphor containing composition can also stick to the stencil opening which reduces the amount of composition remaining on the LED. The stencil openings may also be misaligned to the LED. These problems can result in LEDs having non-uniform color temperature and LEDs that are difficult to consistently reproduce with the same or similar emission characteristics.

Various coating processes of LEDs have been considered, including spin coating, spray coating, electrostatic deposition (ESD), and electrophoretic deposition (EPD). Processes such as spin coating or spray coating typically utilize a binder material during the phosphor deposition, while other processes require the addition of a binder immediately following their deposition to stabilize the phosphor particles/powder.

With these approaches the key challenge is accessing the wire bond pad on the device after the coating process. Accessing the wire bond by standard wafer fabrication techniques is difficult with typical silicone binding material, as well as other binder materials such as epoxies or glass. Silicones are not compatible with commonly used wafer fabrication materials such as acetone, as well as some developers, and resist strippers. This can limit the options and choices for the particular silicones and process steps. Silicones are also cured at high temperature (greater than 150° C.), which is beyond the glass transition temperature of commonly used photoresists. Cured silicone films with phosphor are also difficult to etch and have a very slow etch rate in chlorine and $CF_4$ plasma, and wet etching of cured silicones is typically inefficient.

As a result, typical LEDs are singulated from a wafer, mounted in a package, wire bonded and then coated with a phosphor. With this approach, the phosphor incorporation occurs at the package level, instead of the wafer level. This can result in a process that is costly, difficult to control and is sensitive to packaging geometry effects such as the placement of the wire bond.

SUMMARY OF THE INVENTION

The present invention discloses new methods for fabricating semiconductor devices such as LED chips at the wafer level, and discloses LED chips and LED chip wafers fabricated using the methods. The new methods are particularly applicable to coating LEDs at the wafer level while still leaving the wire bond pads accessible for wire bonding. In accordance with certain aspects of the present invention, the coating can include phosphor particles that downconvert at least some of the light emitted from the active region of the LED chip to produce white light, thereby producing a white LED chip.

One embodiment of a method for fabricating semiconductor devices according to the present invention comprises providing a plurality of semiconductor devices on a substrate and forming a contact on at least some of the semiconductor devices. A containment structure is formed on at least some of the semiconductor devices having a contact with each containment structure defining a deposition area excluding its contact. A coating material is then deposited within the deposition area, with the coating material not covering the contact.

One embodiment of a light emitting diode (LED) chip wafer according to the present invention comprises a plurality of LEDs on a substrate wafer with at least some of the LEDs having a contact. A plurality of containment structures, each of which is associated with a respective one of the plurality of LEDs. Each of the containment structures is at least partially on its respective one of the LEDs and defines a deposition area on its respective one of the LEDs. The deposition area excludes the contact. A coating is included in each of the deposition areas.

One embodiment of a light emitting diode (LED) chip according to the present invention comprises an LED and a contact on the LED. A containment structure is included that is associated with the LED, with the containment structure at least partially on the LED and defining a deposition area on the LED excluding the contact. A coating is included in the deposition area and on the surface of said LED.

These and other aspects and advantages of the invention will become apparent from the following detailed description and the accompanying drawings which illustrate by way of example the features of the invention.

DETAILED DESCRIPTION OF THE INVENTION

The present invention provides fabrication methods that are particularly applicable to wafer level coating of semiconductor devices such as LEDs. The present invention also provides semiconductor devices, such as LEDs fabricated using these methods. The present invention allows for repeatable and consistent coating of LEDs at the wafer level with a down-converter layer (e.g. phosphor loaded silicone) while still allowing access to one or more of the contacts for wire bonding. The phosphor can be applied to the LED chip at the wafer level (prior to dicing) in a defined area, and then fixed in place with a transparent binder such as silicone. This is accomplished while leaving the upper wire bond pad (e.g. n-type bond pad) uncovered by the phosphor and the silicone binder. After testing and dicing, the individual LED chips can be mounted and wire bonded in an LED package using conventional mounting and wire bonding methods without the need for further processing to coat with a down converting phosphor.

According to one aspect of the invention, a patterned surface feature or containment structure can be formed on or around each LED at the wafer level, with the containment structure acting to define the coverage area of the phosphor coating and transparent binder. The containment structure is preferably arranged to prevent phosphor or binder coverage of the wire bond pad. The present invention allows for fabrication, testing and binning of LEDs at the wafer level independent of type of LED lamp packages that the chip will eventually be mounted in. The method can also be scaled to smaller or larger device sizes, and the present invention also eliminates complex wafer fabrication processes to access wire bond pads covered by phosphor and binder coating.

The present invention is described herein with reference to certain embodiments but it is understood that the invention can be embodied in many different forms and should not be construed as limited to the embodiments set forth herein. In particular, the present invention is described below in regards to coating LEDs with a down-converter coating that typically comprises a phosphor loaded binder ("phosphor/binder coating"), but it is understood that the present invention can be used to coat LEDs with other materials for down-conversion, protection, light extraction or scattering. It is also understood that the phosphor binder can have scattering or light extraction particles or materials, and that the coating can be electrically active.

The methods according to the present invention can also be used for coating other semiconductor devices with different materials. Additionally, single or multiple coatings and/or layers can be formed on the LEDs. A coating may comprise one or more phosphors, scattering particles and/or other materials. A coating may also comprise a material such as an organic dye that provides down-conversion. With multiple coatings and/or layers, each one can include different phosphors, different scattering particles, different optical properties, such as transparency, index of refraction, and/or different physical properties, as compared to other layers and/or coatings.

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. As such, variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 1A:
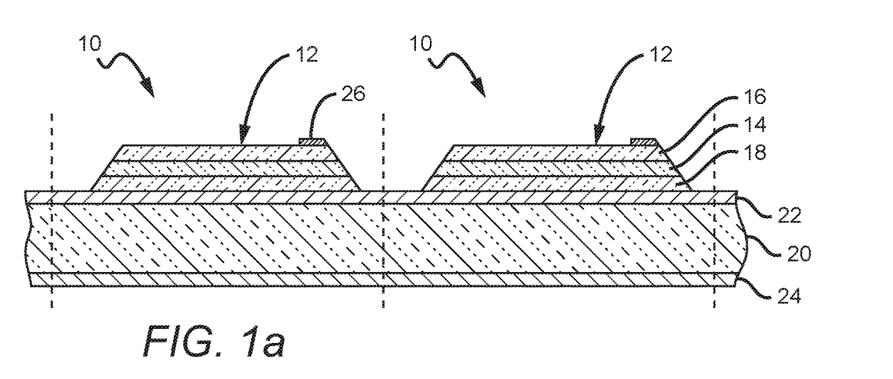
FIGS. 1a through 1h are sectional views of one embodiment of an LED chip wafer at fabrication steps in one method according to the present invention.

FIGS. 1a through 1e show one embodiment of wafer level LED chips 10 manufactured using a method according to the present invention. Referring to FIG. 1a, the LEDs chips 10 are shown at a wafer level of their fabrication process. That is, the LED chips 10 have not been through all the steps necessary before being separated/singulated from wafer into individual LED chips. Phantom lines are included to show the separation or dicing line between the LED chips 10, and following additional fabrication steps the LED chips can be separated into individual devices. FIGS. 1a through 1e also show only two devices at the wafer level, but it is understood that many more LED chips can be formed from a single wafer. For example, when fabricating LED chips having a 1 millimeter (mm) square size, up to 4500 LED chips can be fabricated on a 3 inch wafer.

Each of the LED chips 10 in the wafer comprises a semiconductor LED 12 that can have many different semiconductor layers arranged in different ways. The fabrication and operation of LEDs is generally known in the art and only briefly discussed herein. The layers of the LED 12 can be fabricated using known processes with a suitable process being fabrication using metal organic chemical vapor deposition (MOCVD). The layers of the LEDs 12 generally comprise an active layer/region 14 sandwiched between first and second oppositely doped epitaxial layers 16, 18, all of which can be arranged successively on a substrate 20. In this embodiment the LEDs 12 are shown as separate devices on the substrate 20. This separation can be achieved by having portions of the active region 14 and doped layers 16, 18 etched down to the substrate 20 to form the open areas between the LEDs 12. In other embodiments the active layer 14 and doped layers 16, 18 can remain continuous layers on the substrate 20 and can be separated into individual devices when the LED chips are singulated.

It is understood that additional layers and elements can also be included in the LEDs 12, including but not limited to buffer, nucleation, contact and current spreading layers as well as light reflective and extraction layers and elements. The active region 14 can comprise single quantum well (SQW), multiple quantum well (MQW), double heterostructure or super lattice structures. In one embodiment, the first epitaxial layer 16 is an n-type doped layer and the second epitaxial layer 18 is a p-type doped layer, although in other embodiments the first layer 16 can be p-type doped and the second layer 18 n-type doped. The first and second epitaxial layers 16, 18 are hereinafter referred to as n-type and p-type layers, respectively.

The active region 14 and the n- and p-type layers 16, 18 may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment, the n- and p-type layers 16, 18 are gallium nitride (GaN) and the active region 14 is InGaN. In alternative embodiments the n- and p-type layers 16, 18 may be AlGaN, aluminum gallium arsenide (AlGaAs) or aluminum gallium indium arsenide phosphide (AlGaInAsP).

The substrate 20 can comprise the growth substrate and can be made of many materials such at sapphire, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022. In the embodiment shown, the substrate 20 is at the wafer level, with the plurality of LEDs 12 formed on the wafer substrate 20.

In the embodiment shown, the substrate 20 is not a growth substrate but is instead a carrier substrate with the LED chips flip-wafer bonded to a carrier substrate 20. In this embodiment, the growth substrate can comprise the materials described above for growth substrate 20, but in this embodiment the growth substrate is removed after (or before) flip-wafer bonding, with the substrate removed using known grinding and/or etching processes. The LEDs 12 are wafer mounted to the carrier substrate 20 by mounting layer 22, which is typically one or more bond/metal layers, and which can also serve to reflect light incident on it. In other embodiments, the growth substrate or at least portions thereof can remain on the LEDs. The growth substrate or the remaining portions can be shaped or textured to enhance light extraction from the LEDs.

Each of the LEDs 12 can have first and second contacts 24, 26. In the embodiment shown, the LEDs have a vertical geometry with the first contact 24 on the substrate 20 and the second contact 26 on the n-type layer 16 and serving as a wire bond pad. The first contact 24 is shown as one layer on the substrate, but when the LED chips are singulated from the wafer the first contact 24 will also be separated such that each LED chip 10 has its own portion of the first contact 24. An electrical signal applied to the first contact 24 spreads through the substrate 20 and into the p-type layer 18 and a signal applied to the second contact 26 spreads into the n-type layer 16.

In the case of Group-III nitride devices where the order of the layers is reversed and a p-type layer is the top layer, a thin transparent or semitransparent current spreading layer typically covers some or all of the p-type layer to assist in spreading current from the first contact into the p-type layer. It is understood that the spreading layer can comprise a metal such as platinum (Pt) or a transparent conductive oxide such as indium tin oxide (ITO). The first and second contacts 24, 26 are hereinafter referred to as the n-type and p-type contacts respectively.

As further described below, the present invention can also be used with LEDs having lateral geometry wherein both contacts are on the top of the LEDs. This geometry is typically utilized in embodiments having the p-type layer as the first or upper epitaxial layer and the n-type layer is the second or lower epitaxial layer. A portion of the p-type layer and active region is removed, such as by etching, to expose a contact mesa on the n-type layer. Contacts can then be deposited on the p-type layer and the n-type layer on its contact mesa and the contacts can comprise known materials deposited using known deposition techniques.

Figure 1B:
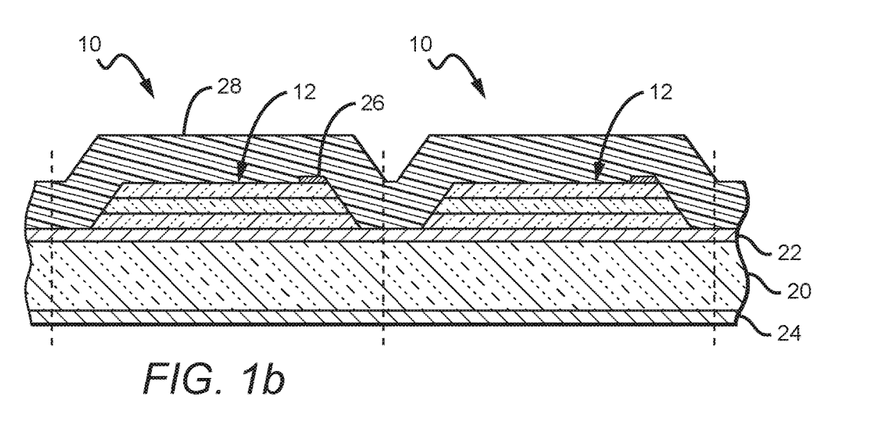

Referring now to FIG. 1b, the LED chips 10 are covered by dielectric phosphor "mask" layer 28 that can comprise different dielectric materials such as silicon nitride, silicon dioxide, or polymers such as benzocyclobutene (BCB) or polymide. The mask layer 28 can have many different characteristics, but should be compatible with known etching processes and should inhibit phosphor coating on its surface. The mask layer should also be made of a material that can be etched to form a "corner" feature that can retain the silicone binder in a dome shape through surface tension/wetting angle effects.

Figure 1C:
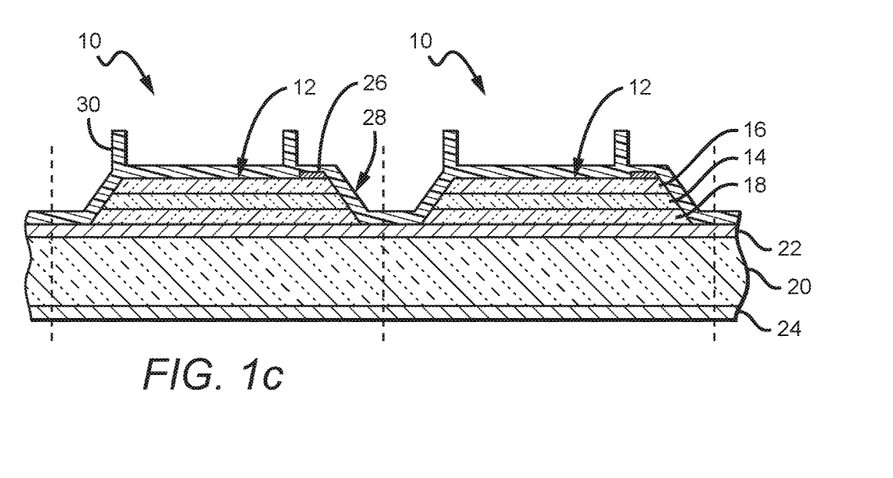

As shown in FIG. 1c a containment structure 30 is formed in the mask layer 28, with the containment structure 30 generally comprising a dam for retaining the phosphor and binding materials in subsequent processing. The dam can take many different shapes and sizes on the LED chips 10 and can be fully on or partially off the LED 12. A suitable height for the dam is in the range of 0.05 to 50 microns (μm), and a suitable width is in the range of 1 to 1000 (μm), although it is understood that other heights and widths can also be used. It is also understood that the height of the dam may be comparable or much less than the final thickness of the phosphor coating and binder. Many different processes can be used to form the dam, such as known photolithography or etching processes such as reactive ion etching, plasma etching, laser etching, etc. The shape formed by the containment structure 30 on the LED 12 can be many different shapes such as circles, rectangles or other complex shapes that can be defined using photolithography or etching.

Figure 1D:
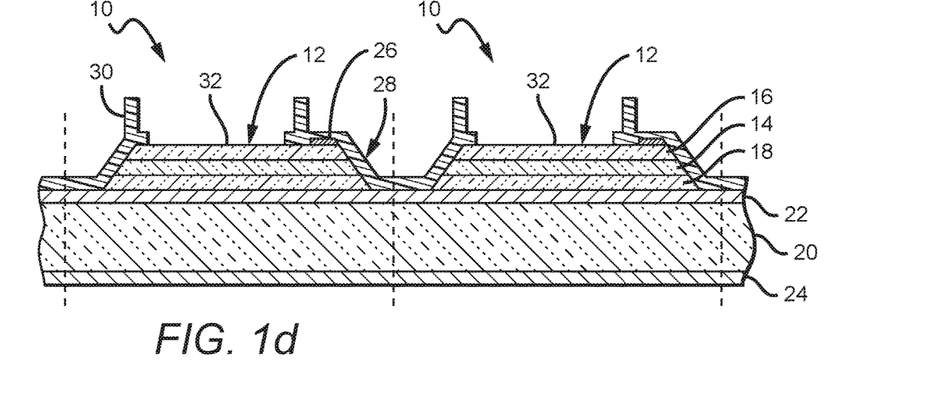

Referring now to FIG. 1d, a portion of the mask layer 28 is etched in the area defined by the containment structure 30 to form a window or opening 32 to the top surface of the LED 12. The same etching processes used to form the containment structure can also be used to form the window 32. The window 32 can etched to form different sized openings depending on the size of the LED 12 and the area that is to be covered by the phosphor. It is also understood that the window 32 can have many different shapes, and in alternative embodiments more than one window can be formed having the same or different shapes.

Figure 1E:
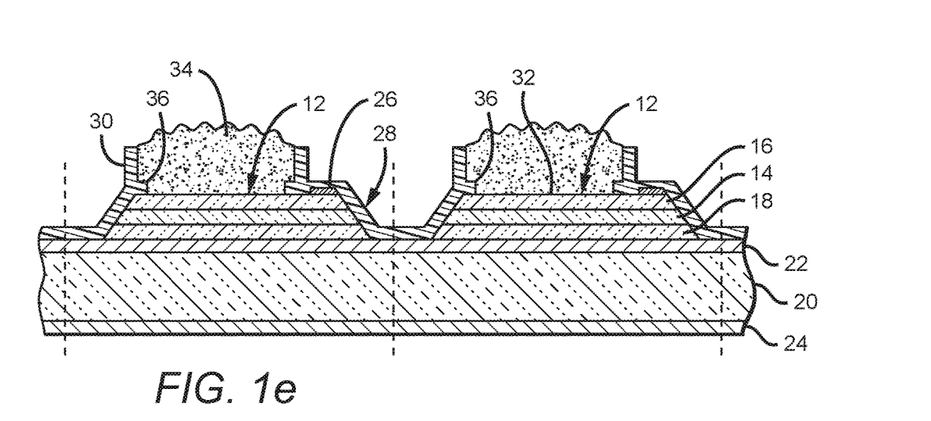

Referring now to FIG. 1e, a phosphor material coating 34 is deposited over the wafer and primarily in the area over each LED 12 defined by the containment structure 30. The phosphor coating 34 can be applied using different processes such as electrophoretic deposition, electro-static plating, powder coating, jet printing or screen printing, and in the embodiment shown, the phosphor is deposited on the wafer using known electrophoretic deposition methods. The wafer and its LEDs are exposed to a solution containing phosphor particles suspended in a liquid. An electrical signal is applied between the solution and the LEDs which creates an electrical field that causes the phosphor particles to migrate to and deposit on the LEDs. The mask layer 28 comprises a dielectric material that interferes with this electric field, so during this process most of the field is generated through the uncovered or window 32 of the layer 28. This causes most or all of the phosphor deposition to occur over the window 32. The process typically leaves the phosphor blanketed over the LEDs in powder form in the areas defined by the containment structure 30. This process can also result in phosphor coatings of different thicknesses. The phosphor can be at the same height as the containment structure 30 or can be above or below the height of the containment structure 30. In one embodiment, the containment structure 30 can have a height of 0.5 microns and a width of 10 microns. The phosphor coating is contained within the containment structure 30 and can have a thickness up to and exceeding 30 microns.

Many different phosphors can be used in the coating 34 according to the present invention. The present invention is particularly adapted to LED chips emitting white light. In one embodiment according to the present invention LEDs 12 emit light in the blue wavelength spectrum and the phosphor absorbs some of the blue light and re-emits yellow. The LED chips 10 emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$:Ce (YAG). Other yellow phosphors that can be used for white emitting LED chips include:

$Tb_{3-x}RE_xO_{12}$:Ce(TAG); RE=Y, Gd, La, Lu; or
$Sr_{2-x-y}Ba_xCa_ySiO_4$:Eu.

First and second phosphors can also be combined for higher CRI white of different white hue (warm white) with the yellow phosphors above combined with red phosphors. Different red phosphors can be used including:

$Sr_xCa_{1-x}$S:Eu, Y; Y=halide;
$CaSiAlN_3$:Eu; or
$Sr_{2-y}Ca_ySiO_4$:Eu

Other phosphors can be used to create saturated color emission by converting substantially all light to a particular color. For example, the following phosphors can be used to generate green saturated light:

$SrGa_2S_4$:Eu;
$Sr_{2-y}Ba_ySiO_4$:Eu; or
$SrSi_2O_2N_2$:Eu.

The following lists some additional suitable phosphors used as conversion particles in LED chips 10, although others can be used. Each exhibits excitation in the blue and/or UV emission spectrum, provides a desirable peak emission, has efficient light conversion, and has acceptable Stokes shift:

Yellow/Green
$(Sr,Ca,Ba)(Al,Ga)_2S_4$:Eu$^{2+}$
$Ba_2(Mg,Zn)Si_2O_7$:Eu$^{2+}$
$Gd_{0.46}Sr_{0.31}Al_{1.23}O_xF_{1.38}$:Eu$^{2+}_{0.06}$
$(Ba_{1-x-y}Sr_xCa_y)SiO_4$:Eu
$Ba_2SiO_4$:Eu$^{2+}$ Red
$Lu_2O_3$:Eu$^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3$:Pr$^{3+}$, Ga$_{3+}$
$CaAlSiN_3$:Eu$^{2+}$
$Sr_2Si_5N_8$:Eu$^{2+}$ Different sized phosphor particles can be used including but not limited to 10-100 nanometer(nm)-sized particles to 20-30 μm sized particles, or larger. Smaller particle sizes typically scatter and mix colors better than larger sized particles to provide a more uniform light. Larger particles are typically more efficient at converting light compared to smaller particles, but emit a less uniform light. In one embodiment, the particle sizes are in the range of 2-5 μm. In other embodiments, the coating 34 can comprise different types of phosphors or can comprise multiple phosphor coatings for monochromatic or polychromatic light sources.

During deposition of the phosphor coating 34, phosphor particles can deposit over the edge of the window 32. To prevent these phosphor particles from covering the containment structure 30, the mask layer 28 can comprise a set-back 36 from the containment structure 30 so that the window starts at a point inside of said containment structure. The set-back is formed from the mask layer 28 and comprises a section of dielectric material between the containment structure 30 to the window 32. The set-back 36 is sized such that any spill-over of phosphor particles during deposition of the coating material builds up on the set back 36 and not on the containment structure 30. The allows the containment structure to have an uncovered "corner" to interact with binder material, as described below.

Figure 1F:
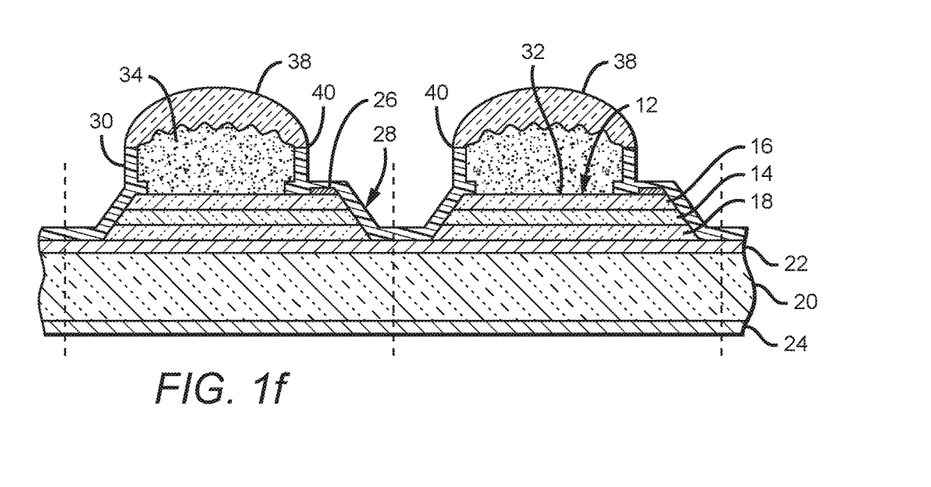

Referring now to FIG. 1*f*, a binder 38 can be deposited in the containment structure to cover and hold the phosphor coating 34. The binder 38 can be applied to the selective areas of the wafer corresponding to the area defined by the containment structure 30. Many different deposition processes can be used, such as micro-dispense, inkjet, screen or stencil printing. Different materials can be used for the binder, with materials preferably being robust after curing and substantially transparent in the visible wavelength spectrum. Suitable material include silicones, epoxies, glass, spin-on glass, BCB, polymides and polymers, with the preferred material being silicone because of its high transparency and reliability in high power LEDs. Suitable phenyl- and methyl-based silicones are commercially available from Dow® Chemical. In other embodiments, the binder material can be engineered to be index matched with the features such as the chip (semiconductor material) and growth substrate, which can reduce total internal reflection (TIR) and improve light extraction.

The binder 38 is deposited in liquid form and then cured using many different curing methods depending on different factors such as the type of binder used. Different curing methods include but are not limited to heat, ultraviolet (UV), infrared (IR) or air curing. Although the binder 38 is deposited in liquid form, preferably does not flow out of the containment structure 30 and over other portions of the LED 12 or wafer. The surface tension between the binder 38 when it is in liquid form and the corner 40 of the containment structure 30 holds the binder 38 in a dome shape over the phosphor coating 34. The binder 38 can then be cured in the dome shape. It is understood, that the shape of the binder will be influenced by the same of the containment structure 30. For example, if the containment structure is square or rectangle shaped the dome shape will have a square or rectangular influence. It is further understood that while the corner 40 is depicted as a right angle, its actual shape can be much more general. The shape can include but is not limited to an angle larger or smaller than a right angle, and smoothly varying or curved rather than abrupt.

Different factors determine the amount of LED light that will be absorbed by the phosphor/binder coating in the final LED chips, including but not limited to the size of the phosphor particles, the percentage of phosphor loading, the type of binder material, the efficiency of the match between the type of phosphor and wavelength of emitted light, and the thickness of the phosphor/binding layer. These different factors can be controlled to control the emission wavelength of the LED chips according to the present invention.

Figure 1G:
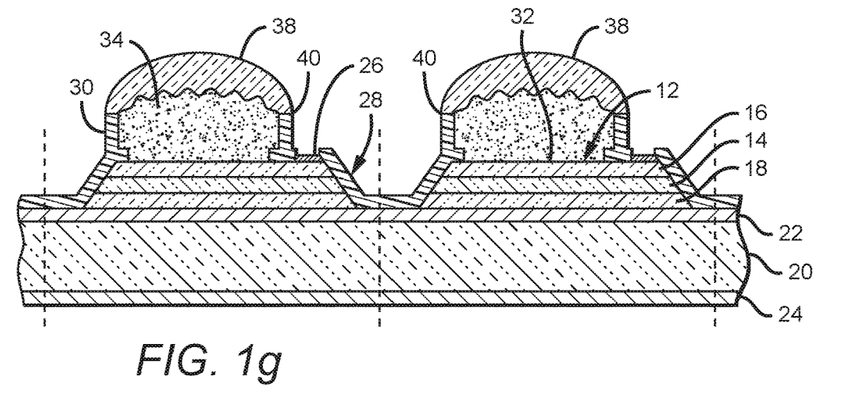
Figure 1H:
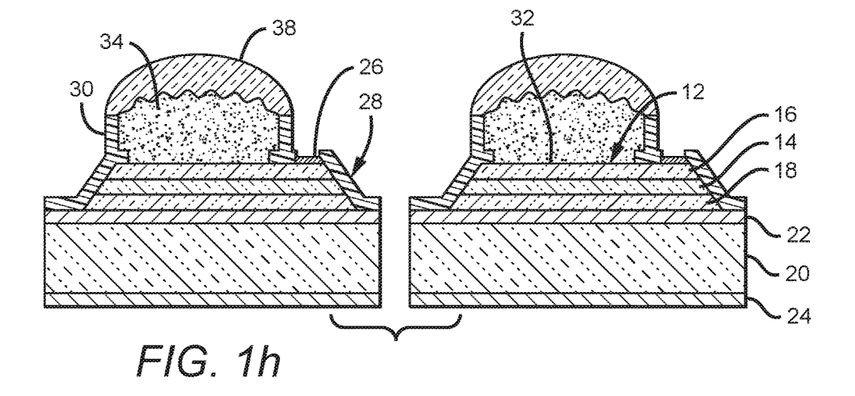

Referring now to FIG. 1*g*, the mask can be etched using the known etching processes described above to reveal the n-type contact 26. Referring now to FIG. 1*h* LED chips can then be singulated from the wafer using known methods such as dicing, scribe and breaking, or etching. This allows for reliable and consistent fabrication of LED chips 10 having similar emission characteristics. As mentioned above, following singulating the LED chips can be mounted in a package, or to a submount or printed circuit board (PCB) without the need for further processing to add phosphor. Each of the individual chips can be mounted and wire bonded in an LED package using conventional mounting and wire bonding methods. For example, the first p-type contact 24 can be electrically connected at the surface of the package, while a wire bond can be coupled from the package to the n-type contact 26. A conventional encapsulation can then surround the LED chip and electrical connections. In another embodiment, the LED chip can be enclosed by a hermetically sealed cover with an inert atmosphere surrounding the LED chip at or below atmospheric pressure.

It is understood that LED chips according to the present invention can be fabricated using different steps and processes than those described above, and the fabrication steps can be performed in different sequences. For example, the n- and p-type contacts can be deposited at a later processing point such as after curing of the binder. The n-type contact can be deposited in an opening etched in the mask layer and the p-type contact can be deposited on the substrate.

Figure 2:
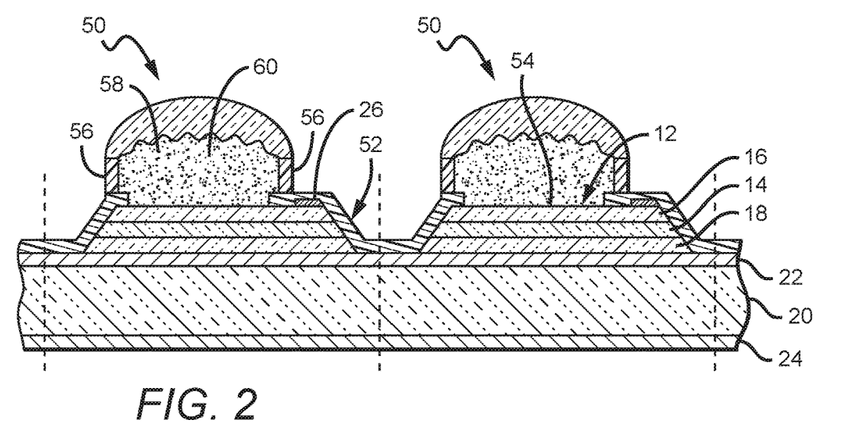
FIG. 2 is a sectional view of another embodiment of an LED chip wafer according to the present invention having a two piece containment structure.

FIG. 2 shows another embodiment of LED chip wafer 50 according to the present invention also fabricated at the wafer level. The LED chips 50 comprise many of the same or similar features as the LED chips 10 described above and for the same or similar features, the same reference numbers are used herein and for the embodiments below with the understanding that the description of these features above applies to the features in this embodiment. Each of the wafer level LED chips 50 comprises an LED 12 sandwiched between n- and p-type layers 16, 18, with each LED 12 arranged on a carrier substrate 20 by a mounting layer 22. A p-type contact 24 is formed on the carrier substrate 20 opposite the LED 12 and an n-type contact 26 is formed on the n-type layer.

The LED chips 50, however, are not covered by a single dielectric mask layer that is etched to form the containment structure. Instead, they are covered by a dielectric phosphor "mask" layer 52 that is etched to form the window 54. The containment structure 56 is not etched from the mask layer 52, but is instead formed on the mask layer from the same or different material as the mask layer 52. The mask layer 52 is formed of the same materials as the mask layer 28 described above and can be etched using the etching processes described above. The electric field formed during electrophoretic deposition is blocked by the mask layer 52 except for through the window 54. As described above, this encourages deposition of the phosphor particles in and around the window 54. Because the containment structure is formed separately from the mask layer 52, it can be formed of any rigid material that can be deposited, formed or placed on the mask layer 52. This can include insulating, semiconductor or metal materials. In other embodiments, the containment structure can be formed separately from the LED chips and placed or bonded in place on the mask layer 52. The containment structure 56 functions to hold the phosphor coating 58 and the binder 60 as described above, with the corner of the containment structure 56 holding the binder 60 in a dome over the phosphor coating 58 until the binder 60 is cured.

Figure 3:
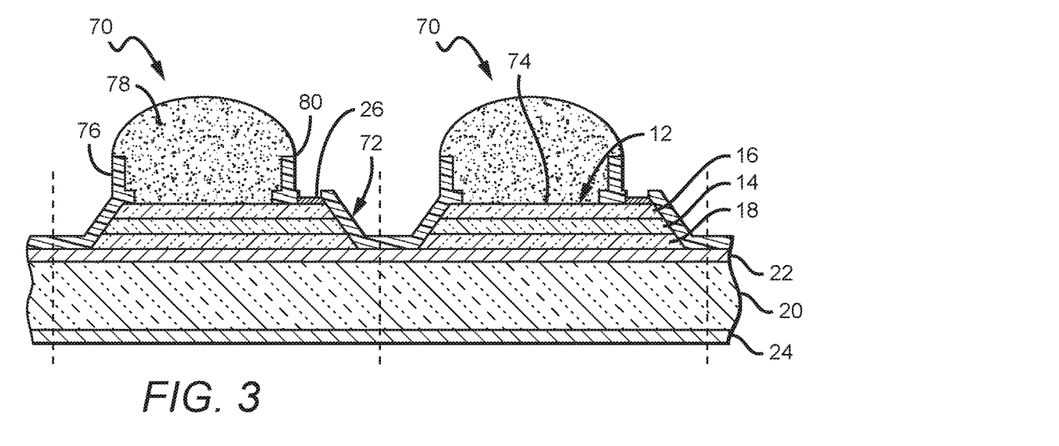
FIG. 3 is a sectional view of another embodiment of an LED chip according to the present invention utilizing a different dispense process.

In alternative embodiments of a wafer level LED chips according to the present invention, the containment structure can be filled with phosphor and binder using different processes. FIG. 3 shows another embodiment of a wafer level LED chips 70 according to the present invention, each of which comprises an LED 12 sandwiched between n- and p-type layers 16, 18, with each LED 12 arranged on a carrier substrate 20 by a mounting layer 22. A first (p-type) contact 24 is formed on the carrier substrate 20 opposite the LED 12 and a second (n-type) contact 26 is formed on the n-type layer. A dielectric mask layer 72 covers LEDs 12, with the mask layer 72 having a window 74 and a containment structure 76.

The containment structure 76 can be filled with binder phosphor mixture 78 in liquid form that can be dispensed into the containment structure by known processes such as micro-dispense, inkjet, screen or stencil printing. The surface tension between the binder/phosphor mixture and the outside corner 80 of the containment structure 76 holds the mixture 78 in a dome over and between the containment structure 76 and over the window 74. The mixture 78 can then be cured using the curing methods described above.

The binding/phosphor mixture can have different concentrations or loading of phosphor materials in the binder, with a typical concentration being in range of 30-70% by weight. In one embodiment, the phosphor concentration is approximately 65% by weight, and is preferably uniformly dispersed throughout the binder. Still in other embodiments the coating can comprise multiple layers of different concentrations of types of phosphors, or a first coat of clear silicone can be deposited followed by phosphor loaded layers.

Figure 4:
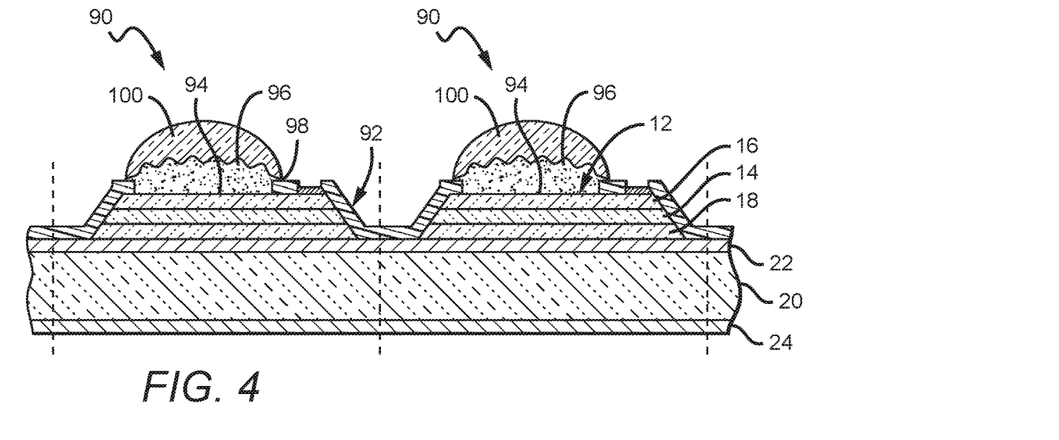
FIG. 4 is a sectional view of another embodiment of an LED chip wafer according to the present invention relying on surface tension for containment.

In other embodiments the wafer level LED chips can be fabricated using other features of the LED chip as the containment structure. These alternative features typically comprise a corner, edge or similar feature to cooperate with the surface tension of the binder to hold the binder in a dome over the phosphor coating. FIG. 4 shows another embodiment of wafer level LED chips 90 according to the present invention wherein the window corner essentially serves as the containment structure. Each LED chip comprises an LED 12 having an active region 14 sandwiched between n- and p-type layers 16, 18, with each LED 12 arranged on a carrier substrate 20 by a mounting layer 22. A first (p-type) contact 24 is formed on the carrier substrate 20 opposite the LED 12 and a second (n-type) contact 26 is formed on the n-type layer. A dielectric mask layer 92 covers LEDs 12, with the mask layer 92 having a window 94 to the LED 12.

A phosphor coating 96 is deposited on the LED 12 at the window 94 using the methods described above, with some of the phosphor coating 96 spilling over onto the surface of the mask layer 92 around the window 94. The phosphor coating 96 comprises a coating edge 98 that forms a corner or containment feature. A binder 100 can be deposited over the phosphor coating 96, with the binder comprising the materials described above and being deposited using the methods described above. The binder 100 is deposited in liquid form and then cured using one of the different curing methods described above. Although the binder 100 is deposited in liquid form, it does not flow over the entire mask layer 92. The surface tension between the liquid binder 100 and the coating edge holds the binder 100 in a dome shape over the phosphor coating 96. The binder 100 can then be cured in the dome shape. The mask layer 92 can be further etched to reveal the second contact 26 using the methods described above, and the LED chips 90 can be singulated and mounted in packages as described above.

Figure 5:
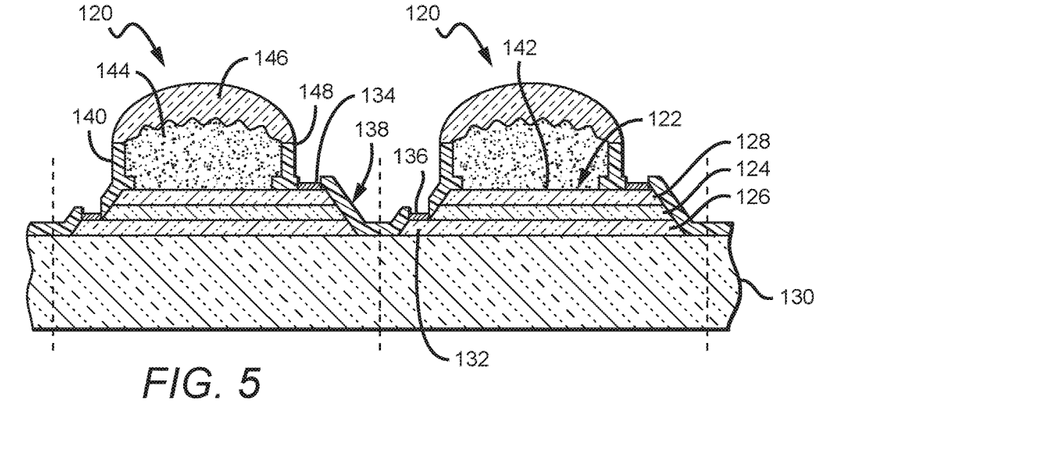
FIG. 5 is a sectional view of another embodiment of an LED chip wafer according to the present invention having lateral geometry LEDs.

Many different LED chip structures and other semiconductor devices can be fabricated according to the present invention. FIG. 5 shows another embodiment of wafer level LED chips 120 according to the present invention having lateral geometry. Each LED chip 120 comprises an LED 122 having an active region 124 sandwiched between n- and p-type layers 126, 128. In this embodiment, each LED 122 is arranged on a growth substrate 130 that can comprise the materials described above. In this embodiment, the order of layers is reversed with the n-type layer 126 being the first layer and the p-type layer 128 being the top layer. It is understood, however, that lateral geometry LEDs can also be fabricated on carrier substrates made of the materials described above, and the order of the active region and n- and p-type layers can be reversed.

In lateral geometry embodiments, each LED 122 is etched through its p-type layer 128 and active region 124 to form an n-type mesa 132. A first p-type contact 134 is formed on the p-type layer 128 and a second n-type contact 136 is formed on the n-type mesa 132. A current spreading layer (not shown can also be included on the p-type layer 128 to spread current from the first contact 134 into the p-type layer 128, with the preferred current spreading layer being a transparent conductor such as those described above.

A dielectric mask layer 138 is deposited over the LEDs 122 covering the exposed surfaces of the LEDs 122 including the first and second contacts 134, 136. The dielectric mask layer 138 is then etched using the methods described above to form a containment structure 140 and window 142. A phosphor and binder can be depositing over the window and within the containment structure using any of the methods described above. As shown in FIG. 5, a phosphor coating 144 is formed over the window and built-up within the containment structure 140. A liquid binder 146 is deposited over the phosphor coating 144, with the corner 148 of the containment structure holding the binder 146 in a dome over the phosphor coating until the binder 146 is cured.

The mask layer 138 can then be etched using the known etching processes described above, but in this embodiment the mask etching is completed to reveal the first contact 124 and the second contact 126. The LED chips can then be singulated from the wafer and can be mounted in a package, or to a submount or printed circuit board (PCB) without the need for further processing to add phosphor. Each of the individual chips can be mounted and wire bonded in an LED package using conventional mounting and wire bonding methods. In this embodiment, however, two wire bonds are used, one for the first contact 134 and the other for the second contact 136. A conventional encapsulation can then surround the LED chip and electrical connections. In another embodiment, the LED chip can be enclosed by a hermetically sealed cover with an inert atmosphere surrounding the LED chip at or below atmospheric pressure.

Figure 6A:
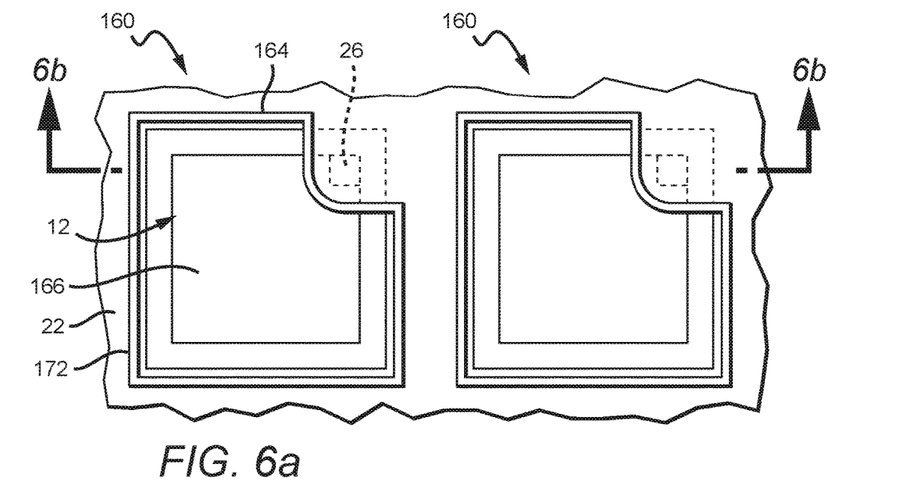
FIGS. 6a through 6c are sectional views of another embodiment of an LED chip wafer at fabrication steps in a method according to the present invention having an off-chip containment structure.
Figure 6B:
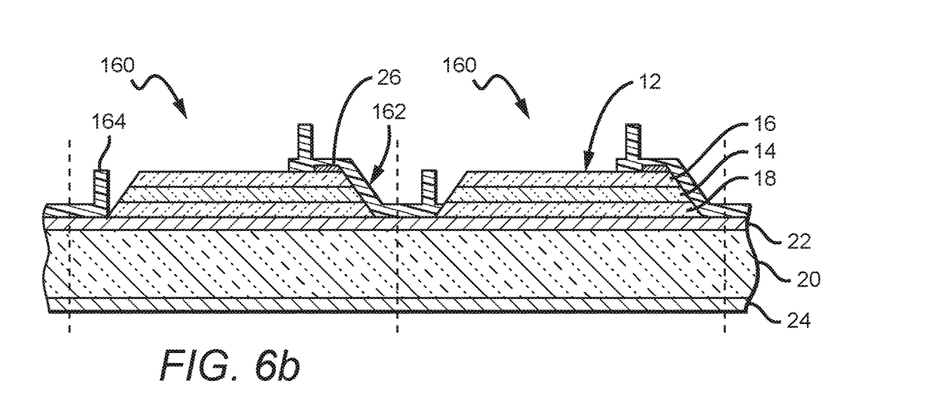
Figure 6C:
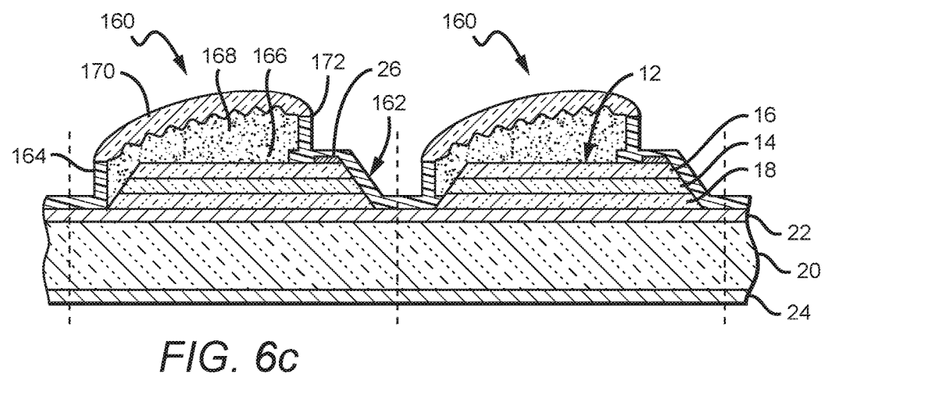

In other embodiments the containment structure can be in different locations on the LED chips to provide for tailored phosphor coverage of the LEDs. FIGS. 6a through 6c show another embodiment of wafer level LED chips 160 according to the present invention wherein each LED chip 160 is similar to the LED chips 10 described above and shown in FIGS. 1a through 1h. Each LED chip 160 comprises an LED 12 having an active region 14 sandwiched between n- and p-type layers 16, 18, with each LED 12 arranged on a carrier substrate 20 by a mounting layer 22. A first (p-type) contact 24 is formed on the carrier substrate 20 opposite the LED 12 and a second (n-type) contact 26 is formed on the n-type layer.

A dielectric mask layer 162 is included over LEDs 12, and the surface of the carrier substrate 20 between adjacent LEDs 12. A containment structure 164 is etched in the layer 162 primarily on the carrier substrate 20 surrounding the LED 12. Each containment structure 164 passes over its respective LED 12 at the location of its second contact 26 so that the second contact is not within the containment structure 164. A window can then be etched in the mask layer 162 to reveal most of the top surface of the LED 12. As shown in FIG. 6c, a phosphor coating 168 and liquid binder 170 can be deposited in the containment structure 164 with the outside corner 172 of the containment structure 164 holding the binder 170 in a dome. The binder 170 can then be cured using the methods described above.

The placement of the containment structure 164 allows for substantially all of the LED 12 to be covered by the phosphor coating 168 with the only uncovered area being the area covered by the second contact 26. The mask layer 162 can be further etched to reveal the second contact 26 and the LED chips 160 can be singulated and packaged as described above.

Figure 7A:
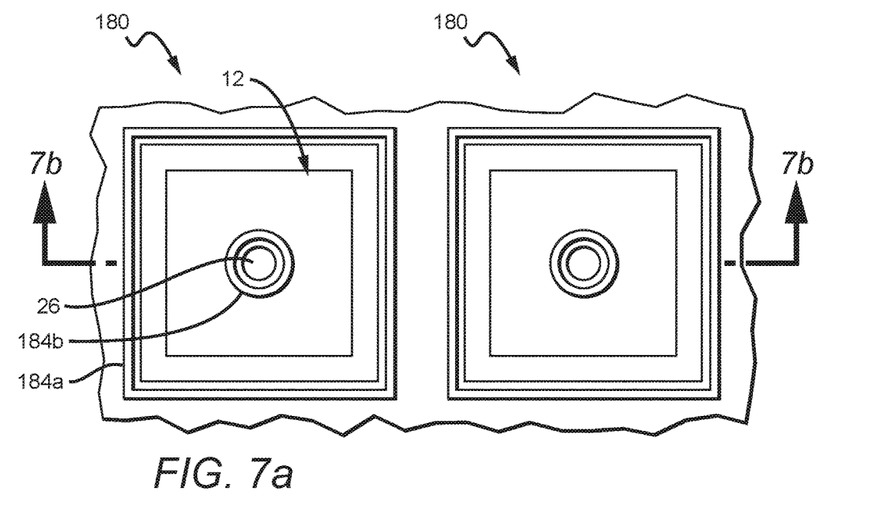
FIG. 7a through 7c are sectional views of another embodiment of an LED chip wafer at fabrication steps in a method according to the present invention having off-chip containment structure.
Figure 7B:
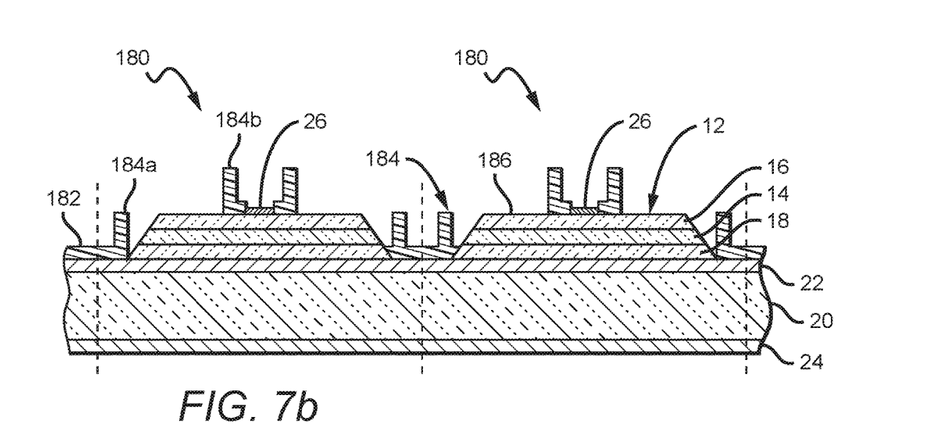
Figure 7C:
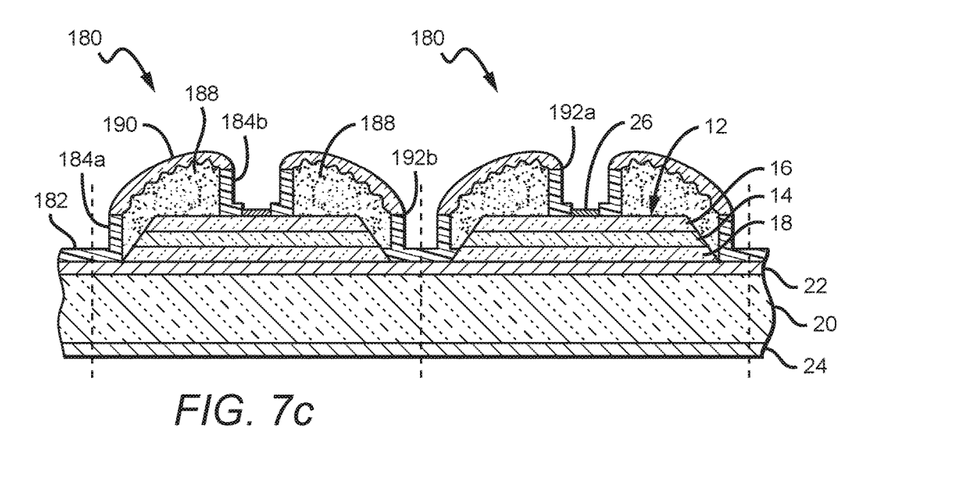

FIGS. 7a through 7c show still another embodiment of wafer level LED chips 180 according to the present invention having a different containment structure arrangement. Each LED chip 180 also comprises an LED 12 having an active region 14 sandwiched between n- and p-type layers 16, 18. Each LED 12 arranged on a carrier substrate 20 by a mounting layer 22. A p-type contact 24 is formed on the carrier substrate 20 opposite the LED 12 and an n-type contact 26 is formed on the n-type layer. In this embodiment the second contact is deposited near the center of the n-type layer. A dielectric mask layer 182 covers the LEDs 12, and the surface of the carrier substrate 20 between adjacent LEDs 12. A containment structure 184 is etched in the layer 182 in two sections. The first section 184a surrounds the LED 12 on the carrier substrate, and the second section 184b surrounds the second contact 26 on the LED 12. A window 186 is formed in the mask layer 182 to reveal the surface of the LED 12 between the first and second sections 184a and 184b. As shown in FIG. 7c, a phosphor coating 188 and liquid binder 190 can be deposited in between the containment structure's first and second sections 184a, 184b with the first section's corner 192a and the second section's corner 192b holding the binder in a dome until cured.

The placement of the containment structure sections 184a, 184b also allows for substantially all of the LED 12 to be covered by the phosphor coating 188 while accommodating the placement of the second contact 26 in the center of the LED. The only area uncovered by the phosphor coating is the area at the center of the LED 12 covered by the second contact 26. The mask layer 182 can be further etched to reveal the second contact 26 and the LED chips 180 can be singulated and packaged as described above.

The LED chips according to the present invention can also comprise features and layers to enhance light extraction. A reflective layer can be arranged that is arranged to reflect light emitted from the active region toward the carrier or substrate, back toward the top of the LED chips. This reflective layer reduces the emission of light from the LEDs that does not pass through conversion material before emitting from the LED chips, such as through the substrate, and encourages emission toward the top of the LED chips and through the phosphor coating.

The reflective layer can be arranged in different ways and in different locations in the LED chip. In one embodiment it can be arranged between the n-type layer and the substrate. The layer can also extend on the substrate beyond the edge of the LEDs. In other embodiments the reflective layer is only between the n-type layer and the substrate. The layer can comprise different materials including but not limited to a metal or a semiconductor reflector such as a distributed Bragg reflector (DBR). In other embodiments, the surfaces of the LED chips, including the cured binder, can be roughened to enhance light extraction. These surfaces can be textured by different methods such as by laser texturing, mechanical shaping, etching (chemical or plasma), or other processes, to enhance light extraction. Texturing results in surface features that are 0.1-5 µm tall or deep, and preferably 0.2-1 µm. In other embodiments, the surface of the LEDs 12 can also be textured or shaped for improved light extraction.

Figure 8:
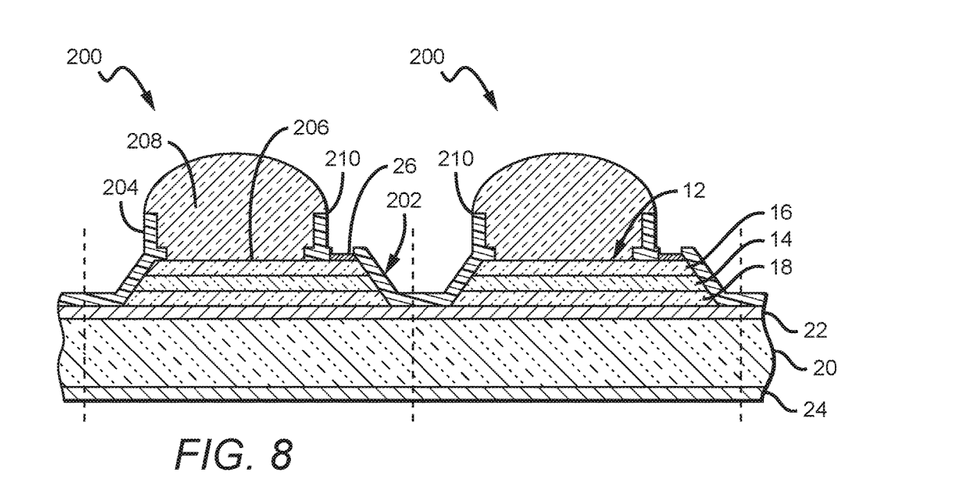
FIG. 8 is a sectional view of still another embodiment of an LED chip wafer according to the present invention having a binder coating.

It is understood that the present invention can be used to coat different semiconductor devices with different material and should not be limited to coating LEDs with phosphors and binders. FIG. 8 shows another embodiment of wafer level LED chips 200 according to the present invention wherein each LED chip 200 comprises an LED 12 having an active region 14 sandwiched between n- and p-type layers 16, 18. Each LED 12 is arranged on a carrier substrate 20 by a mounting layer 22. A first (p-type) contact 24 is formed on the carrier substrate 20 opposite the LED 12 and a second (n-type) contact 26 is formed on the n-type layer.

A dielectric mask layer 202 is deposited over each of the LEDs and a containment structure 204 and window 206 is formed in the mask layer 202 as described above. In this embodiment a phosphor/binder combination is not deposited in the containment structure, but instead a binder 208 only, such as silicone, is deposited. The corner 210 of the containment structure 204 holds the binder 208 in a dome over the window 206 until it is cured. The mask layer 202 can be further etched to reveal the second contact 26, and the LED chips 200 can be singulated and packaged.

This embodiment is particularly applicable to monochromatic LEDs and provides the advantage of high reliability silicone being adjacent to the LEDs emitting surface. This is the region that can experience light and heat induced discoloration, which can be reduced by the presence of the silicone binder 100.

Although the present invention has been described in detail with reference to certain preferred configurations thereof, other versions are possible. Therefore, the spirit and scope of the invention should not be limited to the versions described above.

We claim:
1. A wafer, comprising:
  a plurality of light-emitting diodes (LEDs), each comprising sidewalls;
  a contact on a first area of a surface of each LED in said plurality of LEDs;
  a mask layer on said sidewalls and over at least a portion of said LEDs;
  first and second openings in said mask layer over said first area and a second area on said surface of said LED, respectively;
  wherein a portion of said mask layer comprises a plurality of containment structures, each containment structure comprising a rigid material and coupled to a respective one of said LEDs, wherein each containment structure defines said second area on said surface of each said respective LED, said second area differing from said first area, wherein said containment structure defines the borders of said second opening in said mask layer over said second area;
  a phosphor material coating at least partially contained within each of said containment structures over each said second area on said surface of each said respective LED, wherein said phosphor material coating is excluded from substantially all of said first area and said contact; and a dome shaped binder material, different from the material of said phosphor material coating, and having sidewalls substantially aligned with outer sidewalls of said containment structure.

2. The wafer of claim 1, wherein at least a portion of each of said containment structures is adjacent to its respective LED.

3. The wafer of claim 1, wherein each of said containment structures is on said LED.

4. The wafer of claim 1, further comprising an opening to each said LED, each said window within its respective said second area.

5. The wafer of claim 1, wherein said mask layer extends outside of said containment structures, said mask layer further comprising openings to access said contacts.

6. The wafer of claim 1, further comprising a plurality of openings in said mask layer over respective ones of said LEDs.

7. The wafer of claim 6, wherein each of said openings comprises at least one edge and said at least one edge of said opening comprises one of said containment structures.

8. The wafer of claim 1, wherein each of said containment structures is made of the same material as said mask layer.

9. The wafer of claim 1, wherein said wafer is capable of being separated into LED chips.

10. The wafer of claim 1, wherein said phosphor material coating comprises a phosphor and a binder.

11. The wafer of claim 1, wherein said phosphor material coating comprises a phosphor layer and said dome shaped binder material is located above said phosphor layer.

12. The wafer of claim 11, wherein said dome shaped binder material is located above said containment structure.

13. The wafer of claim 1, wherein said phosphor material coating comprises a textured surface.

14. The claim 1, wherein said phosphor material coating comprises multiple phosphors.

15. The wafer of claim 1, wherein said phosphor material coating comprises scattering particles.

16. The wafer of claim 1, wherein said phosphor material coating comprises a phosphor loaded binder.

17. The wafer of claim 1, wherein said binder comprises one of the materials from the group consisting of silicone, epoxy, glass, spin-on glass, BCB, polymides and polymers.

18. The wafer of claim 1, wherein said phosphor material coating comprises YAG:Ce phosphor.

19. The wafer of claim 1, wherein said LEDs are made of materials from the Group-III nitride material system.

20. The wafer of claim 1, wherein said wafer comprises a growth substrate.

21. The wafer of claim 1, wherein said wafer comprises a carrier substrate.

22. The wafer of claim 1, further comprising a reflective layer formed integral to said wafer.

23. The wafer of claim 1, wherein each LED in said plurality of LEDs is capable of emitting white light.

24. The wafer of claim 1, wherein said rigid material comprises an insulating material.

25. The wafer of claim 24, wherein said insulating material comprises a dielectric material.

26. The wafer of claim 1, wherein said rigid material comprises a semiconductor material.

27. The wafer of claim 1, wherein said rigid material comprises a metal.

28. A light emitting diode (LED) chip, comprising:
an LED comprising sidewalls;
a contact on a first area of a surface of said LED;
a mask layer on said sidewalls and over at least a portion of said LED;
first and second openings in said mask layer over said first area and a second area on said surface of said LED, respectively;
wherein a portion of said mask layer comprises a containment structure, said containment structure comprising a rigid material and coupled to said LED, said containment structure defining said second area differing from said first area on said surface of said LED, wherein said containment structure defines the borders of said second opening in said mask layer over said second area;
a phosphor material coating at least partially contained within said containment structure and over said second area on the surface of said LED, wherein said phosphor material coating is excluded from substantially all of said first area and said contact; and
a dome shaped binder material, different from the material of said phosphor material coating, and having sidewalls substantially aligned with outer sidewalls of said containment structure.

29. The LED chip of claim 28, wherein said mask layer extends outside said containment structure, said mask layer further comprising an opening to access said contact.

30. The LED chip of claim 28, further comprising a window in said mask layer.

31. The LED chip of claim 30, wherein the edge of said window comprises said containment structure.

32. The LED chip of claim 30, wherein said containment structure is a portion of said mask layer, around said window.

33. The LED chip of claim 30, wherein said containment structure is made of the same material as said mask layer.

34. The LED chip of claim 28, wherein said rigid material comprises an insulating material.

35. The LED chip of claim 34, wherein said insulating material comprises a dielectric material.

36. The LED chip of claim 28, wherein said rigid material comprises a semiconductor material.

37. The LED chip of claim 28, wherein said rigid material comprises a metal.

* * * * *